(12) United States Patent
Ueno

(10) Patent No.: US 6,624,725 B2
(45) Date of Patent: Sep. 23, 2003

(54) LATTICE FILTER WITH RIPPLE IN PASSING BAND ELIMINATED AND WITH PASSING BAND WIDENED

(75) Inventor: Moriaki Ueno, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 41 days.

(21) Appl. No.: 10/003,579

(22) Filed: Nov. 2, 2001

(65) Prior Publication Data

US 2002/0053957 A1 May 9, 2002

(30) Foreign Application Priority Data

Nov. 6, 2000 (JP) ........................ 2000-342370

(51) Int. Cl.$^7$ .............. H03H 9/58; H03H 9/64
(52) U.S. Cl. ..................... 333/190; 333/193
(58) Field of Search .................. 333/186–196

(56) References Cited

U.S. PATENT DOCUMENTS 2,045,991 A * 6/1936 Mason .................. 333/190
5,847,626 A * 12/1998 Taguchi et al. ......... 333/193
5,933,062 A   8/1999 Kommrusch ........... 333/193

FOREIGN PATENT DOCUMENTS

JP        2001-223559        8/2001

* cited by examiner

*Primary Examiner*—Barbara Summons
(74) *Attorney, Agent, or Firm*—Brinks Hofer Gilson & Lione

(57) ABSTRACT

Even when a difference between the series resonance frequency and the parallel resonance frequency of each resonator cannot be made large, the passing band will be rendered capable of being widened without causing any ripple in the passing band.

One of each of the first resonator 5 and the first inductance element 7 is connected to each other in series, and is inserted between the first input end 1 and the first output end 2 while the other of each of the first resonator 5 and the first inductance element 7 is connected to each other in series, and is inserted between the second input end 3 and the second output end 4; and one of each of the second resonator 6 and the second inductance element 8 is connected to each other in series and is inserted between the first input end 1 and the second output end 4 while the other of each of the second resonator 6 and the second inductance element 8 is connected to each other in series and is inserted between the second input end 3 and the first output end 2, whereby the parallel resonance frequency of the second resonator 6 is caused to substantially coincide with the series resonance frequency based on the first resonator 5 and the first inductance 7.

4 Claims, 3 Drawing Sheets

LATTICE FILTER WITH RIPPLE IN PASSING BAND ELIMINATED AND WITH PASSING BAND WIDENED

BACKGROUND OF THE INVENTION

1. Field of the Invention

The present invention relates to a lattice filter using a resonator consisting of a crystal vibrator or an elastic surface wave vibrator or the like.

2. Description of the Related Art

FIG. 4 shows structure of a prior art lattice filter. In FIG. 4, between a first input end 11 and a first output end 12, and between a second input end 13 and a second output end 14, there are provided first resonators 15, 15, each having the same characteristic respectively. Also, between the first input end 11 and the second output end 14, and between the second input end 13 and the first output end 12, there are provided second resonators 16, 16, each having the same characteristic respectively.

In this case, the first resonator 15 has a series resonance frequency $f_{1s}$ and a parallel resonance frequency $f_{1p}$ higher than the series resonance frequency $f_{1s}$, and the second resonator 16 has also a series resonance frequency $f_{2s}$ and a parallel resonance frequency $f_{2p}$ higher than the series resonance frequency $f_{2s}$. Also, the parallel resonance frequency of one or the other of the first and second resonator, for example $f_{2p}$ of the second resonator 16, is substantially equal to the series resonance frequency $f_{1s}$ of the first resonator 15, which is the other resonator. Accordingly, reactance curves of these resonators 15, 16 become as shown in FIG. 5.

Further, in these two types of resonators 15, 16, as shown in FIG. 5, their reactance curves have such relationship that they cross each other in a region of lower frequencies than the series resonance frequency $f_{2s}$ of the second resonator 16, and that they cross each other in a region of higher frequencies than the parallel resonance frequency $f_{1p}$ of the first resonator 16. Such crossing relationship can be obtained by setting physical dimensions within the respective resonators.

As a result, a transmission characteristic when a signal is inputted between the first input end 11 and the second input end 13 becomes a characteristic of a band pass filter which has between the series resonance frequency $f_{2s}$ of the second resonator 16 and the parallel resonance frequency $f_{1p}$ of the first resonator 16 as the passing band as shown in FIG. 6.

Also, at frequencies $f_L$ and $f_H$ at which each other's reactance curves cross, phases at two output ends 12 and 14 become the same and therefore, no signal is generated between these two output ends 12 and 14, but a characteristic which attenuates as shown in FIG. 6 is obtained.

Therefore, in order to widen the passing band, a difference ($\Delta 1 = f_{1p} - f_{1s}$, $\Delta 2 = f_{2p} - f_{2s}$) between the series resonance frequency and the parallel resonance frequency of each resonator 15, 16 is made larger, or the parallel resonance frequency $f_{2p}$ of the second resonator 16 is made lower than the series resonance frequency $f_{1s}$ of the first resonator 15, whereby the series resonance frequency $f_{1s}$ of the first resonator 15 can be spaced apart from the parallel resonance frequency $f_{2p}$ of the second resonator 16.

However, the difference between the series resonance frequency and the parallel resonance frequency in each resonator cannot be made much large because of constraints in the physical dimensions, but also for the similar reason, it becomes impossible to freely set a frequency at which the reactance curves cross each other as well.

Also, there is the problem that when the series resonance frequency of the first resonator is spaced apart from the parallel resonance frequency of the second resonator that is higher than the series resonance frequency, a ripple occurs in the transmission characteristic of the passing band.

SUMMARY OF THE INVENTION

Thus, in a lattice filter according to the present invention, even when the difference between the series resonance frequency and the parallel resonance frequency of each resonator cannot be made large, it is an object to make it possible to widen the passing band without causing any ripple in the passing band.

As means for solving the above-described problem, there is provided a lattice filter comprising: two first resonators which are substantially equal to each other in the first series resonance frequency and are substantially equal to each other in the first parallel resonance frequency, that is higher than the first series resonance frequency; two second resonators which are substantially equal to each other in the second series resonance frequency and are substantially equal to each other in the second parallel resonance frequency, that is higher than the second series resonance frequency; two first inductance elements which are substantially equal to each other in the inductance; and two second inductance elements which are substantially equal to each other in the inductance, wherein one of each of the first resonator and the first inductance element is connected to each other in series, and is inserted between the first input end and the first output end while the other of each of the first resonator and the first inductance element is connected to each other in series, and is inserted between the second input end and the second output end; and one of each of the second resonator and the second inductance element is connected to each other in series and is inserted between the first input end and the second output end while the other of each of the second resonator and the second inductance element is connected to each other in series and is inserted between the second input end and the first output end, whereby the parallel resonance frequency of the second resonator is caused to substantially coincide with the series resonance frequency based on the first resonator and the first inductance.

Also, a reactance curve based on the first resonator and the first inductance element and a reactance curve based on the second resonator and the second inductance element are caused to cross each other in a region of lower frequencies than a series resonance frequency based on the second resonator and the second inductance element.

Also, the reactance curve based on the first resonator and the first inductance element and the reactance curve based on the second resonator and the second inductance element are caused to cross each other in a region of higher frequencies than the parallel resonance frequency of the first resonator.

DETAILED DESCRIPTION OF A PREFERRED EMBODIMENT

Figure 1:
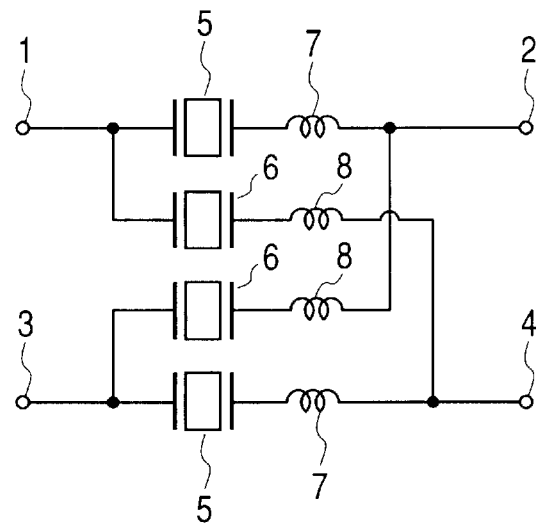
FIG. 1 is a circuit diagram showing structure of a lattice filter according to the present invention.

Hereinafter, with reference to FIGS. 1 to 3, the description will be made of a lattice filter according to the present invention. First, in FIG. 1, between a first input end 1 and a first output end 2, and between a second input end 3 and a second output end 4, there are provided first resonators 5, 5 each having the same characteristic respectively. Also, between the first input end 1 and the second output end 4, and between the second input end 3 and the first output end 2, there are provided second resonators 6, 6 having the same characteristic respectively.

Further, between two first resonators 5 and 5, there are inserted first inductance elements 7, 7, each having the same inductance, and being in series with the respective first resonator 5. Also, between two second resonators 6 and 6, there are inserted second inductance elements 8, 8, each having the same inductance and being in series with the respective second resonator 6. The inductance of the first inductance element 7 is not always equal to the inductance of the second inductance element 8.

In this case, the first resonator 5 has a series resonance frequency $F_{1s}$ and a parallel resonance frequency $F_{1p}$ higher than the series resonance frequency $F_{1S}$, and the second resonator 6 has also a series resonance frequency $F_{2s}$ and a parallel resonance frequency $F_{2p}$ higher than the series resonance frequency $F_{2S}$. Also, the parallel resonance frequency of one or the other of the first and second resonator, for example $F_{2p}$ of the second resonator 6, is lower than the series resonance frequency $F_{1s}$ of the first resonator 5, which is the other resonator. Accordingly, reactance curves of these resonators 5, 6 become as shown by A, B of FIG. 2 respectively.

Figure 2:
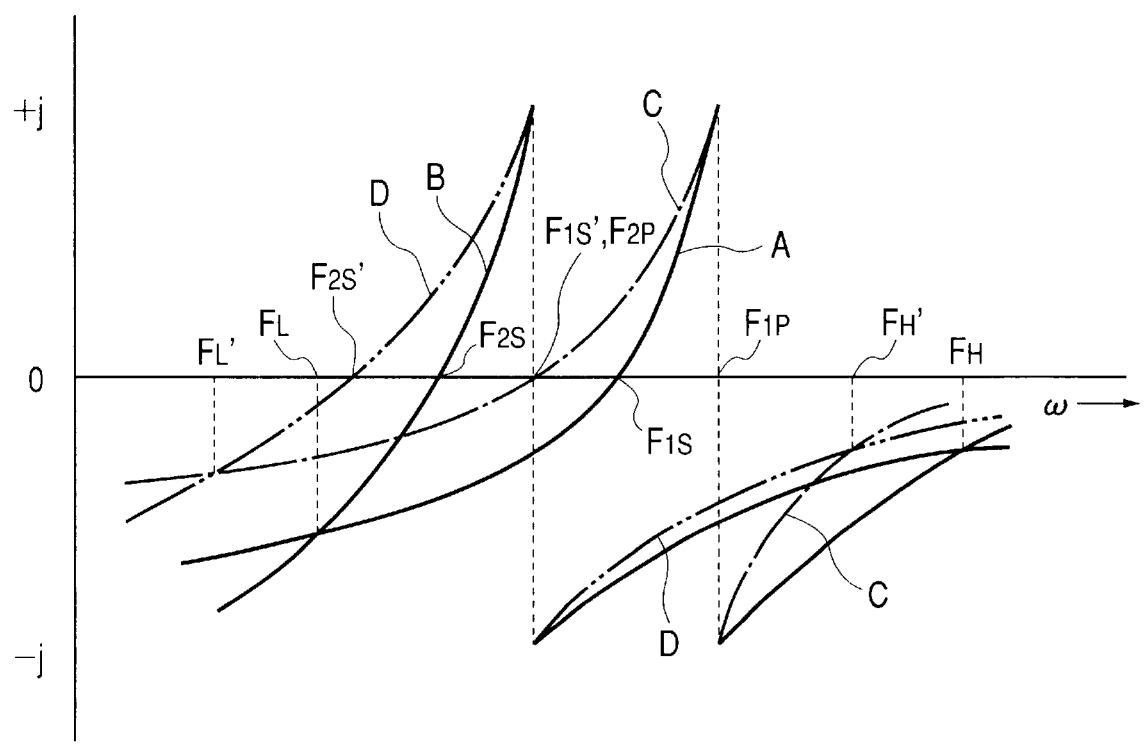
FIG. 2 is a reactance characteristic diagram in the lattice filter according to the present invention.

Further, in these two types of resonators 5, 6, as shown in FIG. 2, their reactance curves have such relationship that they cross each other (the frequency that crosses is indicated by $F_L$) in a region of lower frequencies than the series resonance frequency $F_{2s}$ of the second resonator 6, and that they cross each other (the frequency that crosses is indicated by $F_H$) in a region of higher frequencies than the parallel resonance frequency $F_{1p}$ of the first resonator 6. Such crossing relationship can be obtained by setting the physical dimensions within the respective resonators.

Thus, the first resonator 5 and the first inductance element 7 are connected to each other in series, whereby a reactance curve of this series circuit moves to an inductive side (+j side) as indicated by C of FIG. 2, and therefore, its series resonance frequency $F_{1s}'$ becomes lower than the series resonance frequency $F_{1s}$ of the first resonator 5 (the parallel resonance frequency $F_{1p}$ of the first resonator 5 remains unchanged). The inductance of the first inductance element 7 is set in such a manner that the series resonance frequency $F_{1s}'$ at this time substantially coincides with the parallel resonance frequency $F_{2p}$ of the second resonator 6.

Also, similarly the second resonator 6 and the second inductance element 8 are connected to each other in series, whereby a reactance curve of this series circuit moves to the inductive side (+j side) as indicated by D of FIG. 2, and therefore, its series resonance frequency $F_{2s}'$ becomes lower than the series resonance frequency $F_{2s}$ of the second resonator 6 (the parallel resonance frequency $F_{2P}$ of the second resonator 6 remains unchanged).

Figure 3:
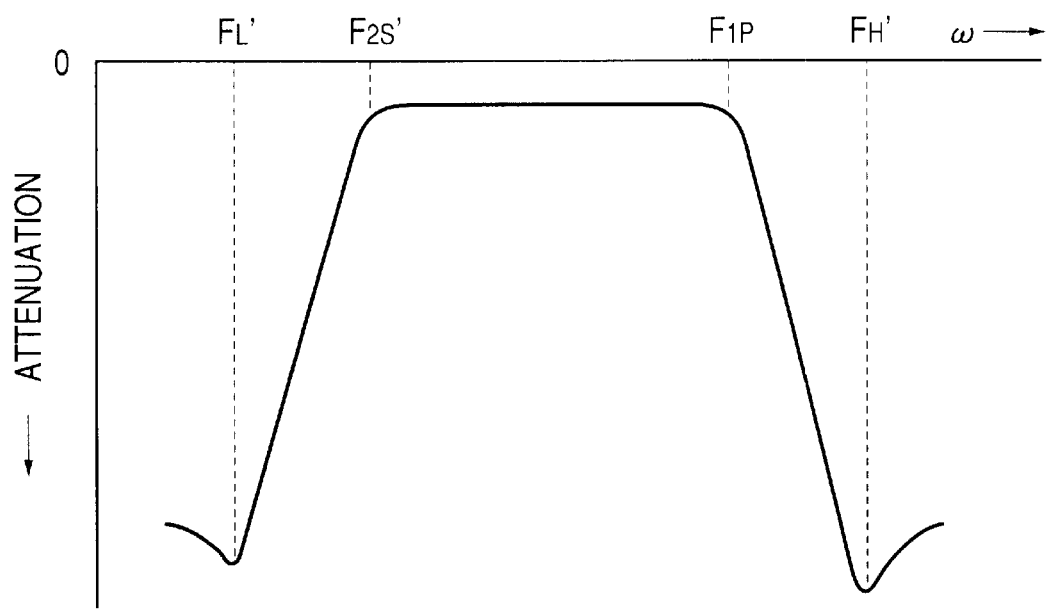
FIG. 3 is a transmission characteristic diagram for the lattice filter according to the present invention.
Figure 4:
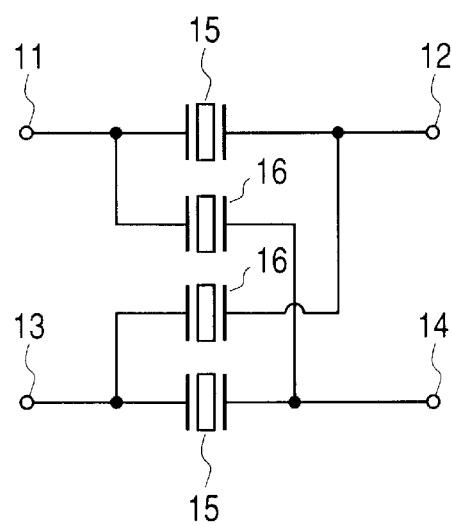
FIG. 4 is a circuit diagram showing structure of a lattice filter according to the prior art.
Figure 5:
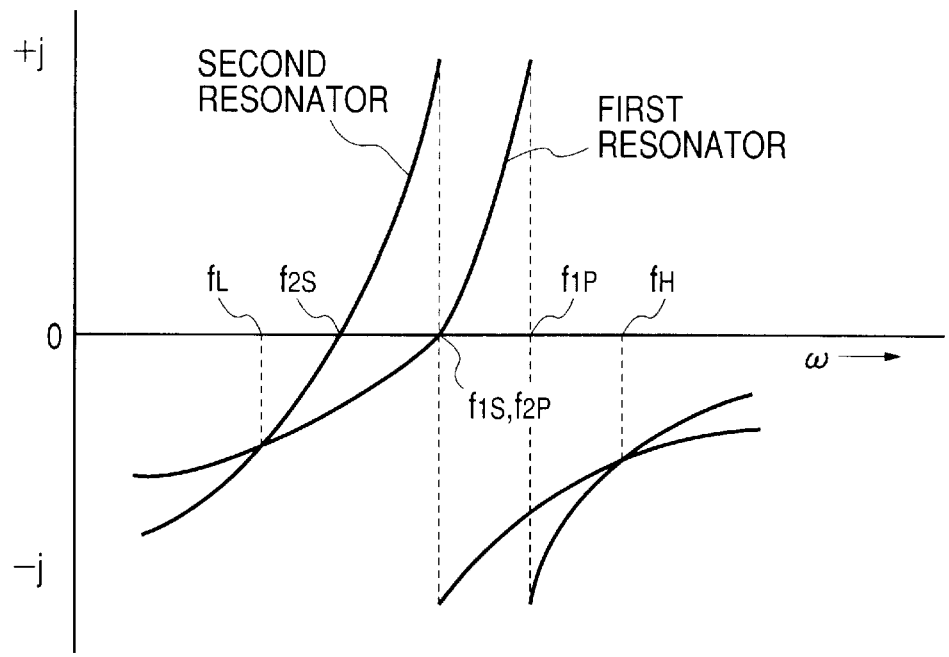
FIG. 5 is a reactance characteristic diagram in the lattice filter according to the prior art.
Figure 6:
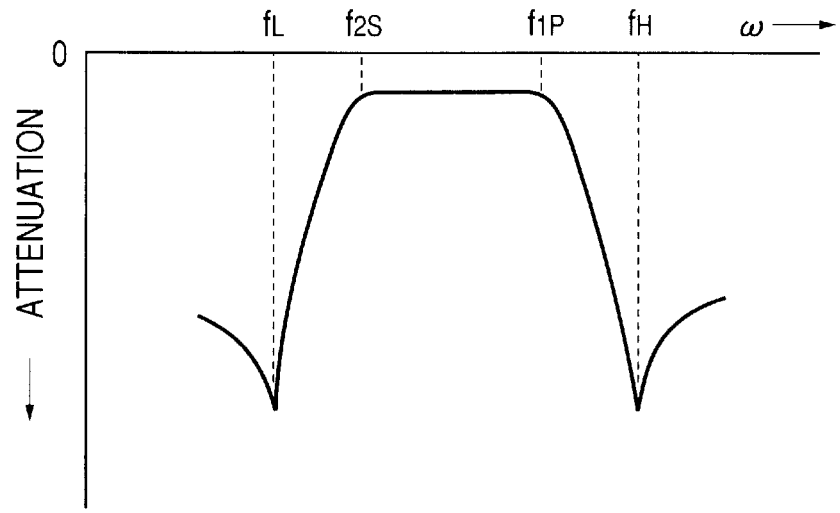
FIG. 6 is a transmission characteristic diagram for the lattice filter according to the prior art.

As a result, a transmission characteristic when a signal is inputted between the first input end 1 and the second input end 3 becomes a characteristic of a band pass filter which has between the series resonance frequency $f_{2s}'$ based on the second resonator 6 and the second inductance element 8 and the parallel resonance frequency $F_{1p}$ of the first resonator 6 as the passing band as shown in FIG. 3 so that the passing band becomes wider. In this case, since the series resonance frequency $F_{1s}'$ based on the first resonator 5 and the first inductance element 7 substantially coincides with the parallel resonance frequency $F_{2p}$ of the second resonator 6, ripples within the passing band are reduced.

Also, a frequency ($F_L'$, $F_H'$), at which a reactance curve based on the first resonator 5 and the first inductance element 7 and a reactance curve based on the second resonator 6 and the second inductance element 8 cross with each other, deviates from a frequency ($F_L$, $F_H$), at which a reactance curve of the first resonator 5 alone and a reactance curve of the second resonator 6 alone cross each other, but the direction of the deviation and the frequency vary with inductance values of the first and second inductance elements 7, 8.

In the frequencies $F_L'$, $F_H'$ that cross each other, since phases of signals at two output ends 2, 4 become the same, no signal is generated between these two output ends 2 and 4, but a characteristic that attenuates as shown in FIG. 3 is obtained.

In this case, an angle θ (See FIG. 2) when those reactance curves cross each other is determined by setting of the series resonance frequency ($F_{1S}$, $F_{2S}$) and the parallel resonance frequency ($F_{1P}$, $F_{2P}$) of each resonator 5, 6 and inductance values of each inductance element 7, 8, but the smaller the angle θ becomes, the wider the band of frequency that attenuates becomes. In the present invention, since two inductance elements 7, 8 are used, the width of the passing band, the attenuation frequency and the degree of freedom for setting of its band are widened.

As described above, one of each of the first resonator and the first inductance element is connected to each other in series, and is inserted between the first input end and the first output end while the other of each of the first resonator and the first inductance element is connected to each other in series, and is inserted between the second input end and the second output end; and one of each of the second resonator and the second inductance element is connected to each other in series and is inserted between the first input end and the second output end while the other of each of the second resonator and the second inductance element is connected to each other in series and is inserted between the second input end and the first output end, whereby the parallel resonance frequency of the second resonator is caused to substantially coincide with the series resonance frequency based on the first resonator and the first inductance. Therefore, a band pass filter having less ripples and a wide band can be constituted.

Also, a reactance curve based on the first resonator and the first inductance element and a reactance curve based on the second resonator and the second inductance element are caused to cross each other in a region of lower frequencies than a series resonance frequency based on the second resonator and the second inductance element. Therefore, it is possible to attenuate in a region of lower frequencies than the passing band, and as yet to change the band of the frequency that attenuates by setting inductance values of each inductance element, and the like.

Also, the reactance curve based on the first resonator and the first inductance element and the reactance curve based on the second resonator and the second inductance element are caused to cross each other in a region of higher frequencies than the parallel resonance frequency of the first resonator. Therefore, it is possible to attenuate in a region of higher frequencies than the passing band, and as yet to change the band of the frequency that attenuates by setting inductance values of each inductance element, and the like.

What is claimed is:

1. A lattice filter, comprising: two first resonators, which are substantially equal to each other in a first series resonance frequency and which are substantially equal to each other in a first parallel resonance frequency, the first parallel resonance frequency being higher than the first series resonance frequency; two second resonators, which are substantially equal to each other in a second series resonance frequency and which are substantially equal to each other in a second parallel resonance frequency, the second parallel resonance frequency being higher than the second series resonance frequency; two first inductance elements which are substantially equal to each other; and two second inductance elements which are substantially equal to each other, wherein a reactance curve of the first resonator and a reactance curve of the second resonator cross each other at a first location in a region of lower frequencies than a series resonance frequency of the second resonator, and cross each other at a second location in a region of higher frequencies than the first parallel resonance frequency by appropriately setting physical dimensions within the first and second resonators;

one of each of the first resonators and the first inductance elements are connected to each other in series and inserted between a first input end and a first output end while the other of each of the first resonators and the first inductance elements are connected to each other in series and inserted between a second input end and a second output end; and one of each of the second resonators and the second inductance elements are connected to each other in series and inserted between the first input end and the second output end while the other of each of the second resonators and the second inductance elements are connected to each other in series and inserted between the second input end and the first output end, whereby the second parallel resonance frequency substantially coincides with a series resonance frequency of a combination of the first resonator and the first inductance.

2. The lattice filter according to claim 1, wherein a reactance curve of the combination of the first resonator and the first inductance element and a reactance curve of a combination of the second resonator and the second inductance element cross each other in a region of lower frequencies than a series resonance frequency of the combination of the second resonator and the second inductance element by setting the physical dimensions within the first and second resonators.

3. The lattice filter according to claim 1, wherein a reactance curve of the combination of the first resonator and the first inductance element and a reactance curve of a combination of the second resonator and the second inductance element cross each other in a region of higher frequencies than the first parallel resonance frequency by setting the physical dimensions within the first and second resonators.

4. The lattice filter according to claim 1, wherein the series resonance frequency based on the first resonator and the first inductance element substantially coincides with the parallel resonance frequency of the second resonator, thereby reducing ripples within a passing band.

* * * * *